(12) United States Patent
Steiger et al.

(10) Patent No.: US 9,804,219 B2
(45) Date of Patent: Oct. 31, 2017

(54) TESTING CONTAINER

(71) Applicant: ABB TECHNOLOGY AG, Zürich (CH)

(72) Inventors: Matthias Steiger, Bitterfeld-Wolfen OT Holzweissig (DE); Peter Werle, Walsrode (DE); Janusz Szczechowski, Leipzig (DE); Andreas Kirschmann, Allstedt / OT Sotterhausen (DE); Oleg Kouzmine, Dusseldorf (DE)

(73) Assignee: ABB Schweiz AB, Baden (CH)

( * ) Notice: Subject to any disclaimer, the term of this patent is extended or adjusted under 35 U.S.C. 154(b) by 798 days.

(21) Appl. No.: 14/268,537

(22) Filed: May 2, 2014

(65) Prior Publication Data

US 2014/0239990 A1 Aug. 28, 2014

Related U.S. Application Data

(63) Continuation of application No. PCT/EP2012/004303, filed on Oct. 16, 2012.

(30) Foreign Application Priority Data

Nov. 2, 2011 (EP) ..................................... 11008719

(51) Int. Cl.
*G01R 31/02* (2006.01)
*H05K 7/14* (2006.01)
(Continued)

(52) U.S. Cl.
CPC ............ *G01R 31/027* (2013.01); *E04H 5/04* (2013.01); *H05K 7/1497* (2013.01); *B65D 88/744* (2013.01)

(58) Field of Classification Search
CPC combination set(s) only.
See application file for complete search history.

(56) References Cited

U.S. PATENT DOCUMENTS

2010/0301672 A1 12/2010 Di
2011/0121853 A1 5/2011 Werle et al.
(Continued)

FOREIGN PATENT DOCUMENTS

| DE | 20 2004 00809 U1 | 12/2004 |
| EP | 2 133 704 A1 | 12/2009 |
| JP | 57-000431 A | 1/1982 |

OTHER PUBLICATIONS

International Search Report (PCT/ISA/210) dated Dec. 17, 2012, by the European Patent Office as the International Searching Authority for International Application No. PCT/EP2012/004303.

*Primary Examiner* — Clayton E Laballe
*Assistant Examiner* — Jas Sanghera
(74) *Attorney, Agent, or Firm* — Barnes & Thornburg LLP

(57) ABSTRACT

A testing container includes a right-parallelepiped-like container, electrical components of a transformer test system which are arranged in the container and which represent a respective heat source during a testing operation, and a cooling system including at least one heat exchanger. In addition, the testing container includes a movement apparatus configured to move the at least one heat exchanger from a transport position within the container into a working position which is located at least partially outside the container. Thus, the at least one heat exchanger is movable by means of the movement apparatus from the transport position within the container into the working position which is located at least partially outside the container.

19 Claims, 3 Drawing Sheets

(51) Int. Cl.
*E04H 5/04* (2006.01)
*B65D 88/74* (2006.01)

(56) References Cited

U.S. PATENT DOCUMENTS

2011/0128013 A1  6/2011  Werle et al.
2011/0133749 A1  6/2011  Werle et al.

TESTING CONTAINER

RELATED APPLICATIONS

This application claims priority as a continuation application under 35 U.S.C. §120 to PCT/EP2012/004303, which was filed as an International Application on Oct. 16, 2012 designating the U.S., and which claims priority to European Application 11008719.4 filed in Europe on Nov. 2, 2011. The entire contents of these applications are hereby incorporated by reference in their entireties.

FIELD

The present disclosure relates to a testing container. More particularly, the present disclosure relates to a testing container which includes a right-parallelepiped-like container, electrical components of a transformer test system which are arranged in the container and which represent a respective heat source during testing operation, and an associated cooling system including at least one heat exchanger.

BACKGROUND

It is generally known that high-voltage transformers, for example, in a voltage range of from 110 kV or 380 kV and in a power range of 100 MVA or higher, both for inspection purposes and after termination of any possible maintenance or repair work or else directly after their fabrication, need to be tested intensively in order to ensure their correct functioning for the next operation time period, which is often a number of years. Both stationary and mobile testing stations are used. The latter are in particular constructed for in-situ testing of transformers, then dismantled and transported to the next use location. Even when the transport and construction of a mobile testing station is usually associated with a very high degree of complexity, this complexity is usually nevertheless lower than the complexity involved in transporting a transformer with a weight of for example 200 t to a stationary testing station. Advantageously, in addition the downtime of a transformer undergoing testing is then significantly reduced.

In this case, both DC and AC testing stations are used, with which the corresponding test conditions can be produced. In particular, AC testing stations need to be capable of providing a high electrical testing power with variable frequency and variable voltage over a relatively long time period, often lasting several hours, for example for a continuous load test or a short-circuit test. In this case, owing to their high degree of flexibility, rotary converters have proven successful, but they have also proven very maintenance-intensive owing to the mechanical wear. In addition, the transport, construction and dismantling of such a converter is very labor-intensive and additional vibration-damping measures need to be provided for the installation subsurface.

It has therefore proven disadvantageous in the case of existing AC testing station systems that they require a high level of complexity for transport, construction and dismantling and, owing to the rotary converter which is typically used, are also very maintenance-intensive.

SUMMARY

An exemplary embodiment of the present disclosure provides a testing container which includes a right-parallelepiped-like container, electrical components of a transformer test system which are arranged in the container and which represent a respective heat source during a testing operation, and a cooling system including at least one heat exchanger. In addition, the exemplary testing container includes a movement apparatus configured to move the at least one heat exchanger from a transport position within the container into a working position which is located at least partially outside the container. Thus, the at least one heat exchanger is movable by means of the movement apparatus from the transport position within the container into the working position which is located at least partially outside the container.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
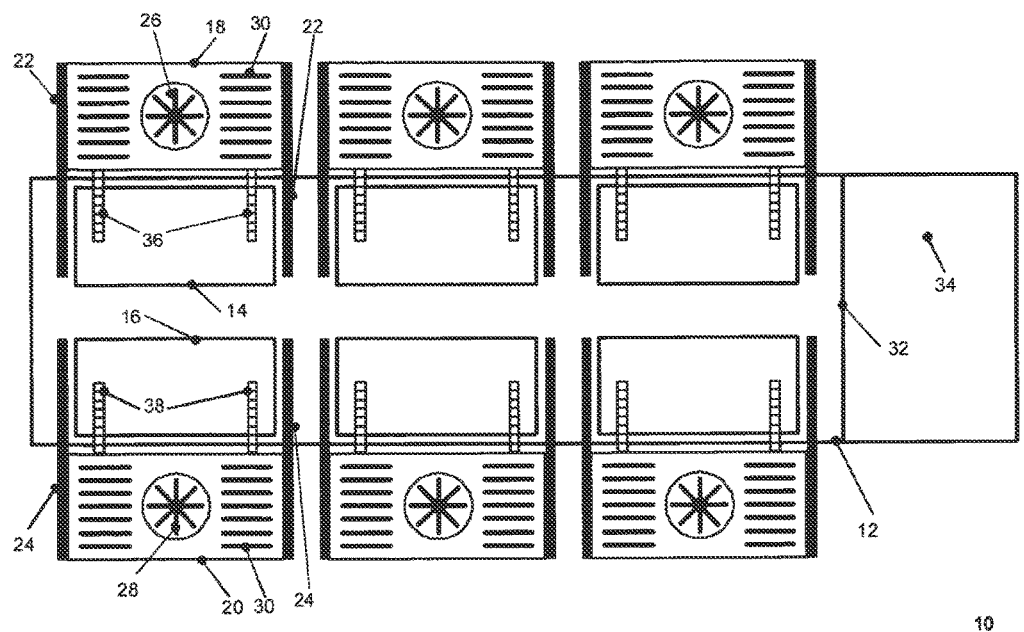
FIG. 1 shows a testing container in the working position according to an exemplary embodiment of the present disclosure.

In view of the drawbacks associated with conventional techniques as discussed above, exemplary embodiments of the present disclosure provide a testing station system or testing station system components for testing high-voltage transformers which enable particularly simple transport, construction and dismantling of the testing station system and avoid a rotary converter. An exemplary embodiment of the present disclosure provides a testing container which includes a right-parallelepiped-like container, electrical components of a transformer test system which are arranged in the container and which represent a respective heat source during a testing operation, and a cooling system including at least one heat exchanger.

In accordance with an exemplary embodiment of the testing container, a movement apparatus is provided, by means of which the at least one heat exchanger is movable from a transport position within the container into a working position which is located at least partially outside the container.

Exemplary embodiments of the present disclosure are based on the concept of first constructing a testing station system, on the one hand, at least partially from standardized modules which are easy to transport and can be connected to one another in situ, for example, by corresponding electrical plug-type connections, in a simple manner to form a complete testing system. Secondly, the respective modules, as far as possible, need to be configured so as to be electrically efficient in order to thus reduce the number of modules and therefore also the complexity involved in the transport and installation of a complete test system in an advantageous manner. In order to particularly simplify the transport of such a module, a container or a comparable right-parallelepiped-like receptacle is provided as enclosure, in which at least the plurality of the components of the testing system is permanently installed and also does not need to be rearranged again once the receptacle has been erected in situ. As a result, the construction in situ is also advantageously simplified.

In accordance with an exemplary embodiment of the present disclosure, instead of a rotary converter, power electronics components, for example, inverters and rectifiers, are provided, by means of which conversion of the supply voltage, for example 6 kV or 10 kV, to the desired frequency or voltage level takes place. If necessary, a testing transformer is also provided for the testing system according to the present disclosure in order to enable a voltage transformation of the test voltage by a higher factor, for example in a range of from 2 to 20.

Inverters or rectifiers are known, for example, from the field of high-voltage DC transmission. Owing to the unavoidable converter losses which are in the region of 1% to 5% of the respective rated power on full load per converter, for example, there results a high power loss in particular during continuous operation of such rectifiers and/or inverters, for example at a rated power of 5 MVA and efficiency of 95%, a power loss of 250 kW which needs to be dissipated continuously.

For instance, in the case of an exemplary arrangement according to the present disclosure of the converters in a module-like container, during operation of the test system, the problem arises of the dissipation of the heat output from the container which occurs, for which reason a cooling system is required. However, a cooling system likewise takes up space within the container or right-parallelepiped-like receptacle, as a result of which the maximum inverter power which can be installed within the container is reduced in a disadvantageous manner and, given a predetermined installed power, the number of converter containers required is increased. In terms of its dimensions, the container is not capable of being extended as desired, but instead its outer dimensions are preferably suited to conventional transport profiles, i.e. in particular to the dimensions of a standard transport container. These are 2.438 m in width, 2.591 m in height and 6.058 m or 12.192 m in length, wherein it is of course also possible and expedient for other conventional profiles to be used.

In order to realize both an installed inverter power which is as high as possible within given container dimensions and to provide a cooling system with sufficient cooling power therefor, in accordance with an exemplary embodiment of the present disclosure, a movement apparatus is provided, by means of which the at least one heat exchanger is movable from a transport position within the container into a working position which is located at least partially outside the container. The restrictions in respect of the external dimensions of the container or container-like receptacle are therefore only relevant in the specific case of transport of the container. If the container has been erected in situ, it is easily possible for the transport dimensions to be exceeded.

A cooling system includes at least one heat exchanger, which outputs the heat to be dissipated from a medium flowing through the interior of the heat exchanger, for example air or a cooling liquid, to a second medium surrounding the heat exchanger, for example to the ambient air. The performance of a heat exchanger is greater the greater the indirect contact area provided by the heat exchanger between the two media. As a result of the arrangement of the heat exchanger in a transport position within the container, firstly a very space-saving arrangement is provided, whereas, in the withdrawn state, in a working position, advantageously a considerable enlargement of the respective contact areas is provided, with the result that, despite compact transport dimensions, nevertheless a high level of performance of the heat exchanger is provided.

The rated power of electrical components, for example of converters, producing heat loss which can be installed within a testing container is therefore advantageously increased with the given external dimensions of the container.

In accordance with an exemplary embodiment of a configuration of the testing container according to the present disclosure, the cooling system includes a closed cooling circuit of a cooling medium, wherein the at least one heat exchanger is a condenser and at least one evaporator connected to the condenser via the cooling circuit is provided in the container interior. The cooling medium draws the thermal energy to be dissipated from the components to be cooled, for example an inverter, via an evaporation process in the evaporator and outputs this thermal energy, via a condensation process taking place in the condenser, to a further medium such as the ambient air. As a result, the effectiveness of the cooling system is advantageously increased. In addition, a condenser can be arranged in a targeted manner at a point heat source, for which reason the effectiveness of the cooling system is even further increased.

In accordance with an exemplary embodiment of the testing container according to the present disclosure, the cooling circuit is formed between the at least one movable condenser and the at least one evaporator at least sectionally by a flexible hose line. This enables problem-free movement of the evaporator out of the testing container, without the closed cooling circuit being affected. It goes without saying that also any other type of flexible lines is suitable for producing a movable connection between the evaporator and the condenser.

In accordance with an exemplary embodiment of the testing container according to the present disclosure, a plurality of evaporators are provided in the direct vicinity of respective heat sources in the container interior. As a result of such a ramification of the cooling circuit, the heat sources, in particular the respective converters, are cooled directly, for which reason correspondingly less heat can propagate directly in the container interior. The number of converters, i.e. rectifiers and inverters, is dependent on the desired electrical power or voltage. Thus, for example, 12 or more identical converters can be provided easily within a testing container, which converters are then connected electrically in parallel with one another, for example.

In accordance with a an exemplary embodiment of the testing container according to the present disclosure, the at least one heat exchanger or else condenser is movable in drawer-like fashion through openings provided for this purpose out of a side wall of the container. For this purpose, for example, telescopic rails are arranged on both sides of the condenser, which is preferably flat and has a rectangular horizontal section, which rails are movable by means of a drive apparatus, if required. Such a drawer-like movement enables particularly simple change in position from a transport position of the heat exchanger into a working position and back again and also enables the space-saving parallel arrangement of a plurality of heat exchangers in a common plane. Corresponding to another exemplary embodiment of the present disclosure, a plurality of heat exchangers are movable out of one or more side walls of the container. This makes it possible, inter alia, to cover a complete plane within the container with the heat exchangers withdrawn in the respective transport position, for example, which is then completely or at least virtually completely extended in the respective working position.

According to an exemplary embodiment of the present disclosure, means for effecting a forced flow of ambient air around or through the at least one heat exchanger are provided. These means are, for example, a fan or another blower which is directed onto the outer surface of the at least one heat exchanger or else condenser. This fan or blower can be regulated in such a way that it is only activated when there is an increased cooling requirement. The cooling power is thus advantageously increased.

According to an exemplary configuration of the testing container according to the present disclosure, the testing container has the dimensions of a standard transport container and is approved in accordance with CSC. Approval in accordance with CSC (International Convention for Safe Containers) enables, inter alia, the arrangement of the container in any desired position of a container stack on a cargo ship. By adhering to the dimensions of a standard container (according to CSC standardization), a large number of transportation means such as rail, ship or lorry is available, with which problem-free transport is ensured.

In accordance with an exemplary configuration of the testing container of the present disclosure, the testing container has an internal supporting structure including hollow struts, wherein at least some of the hollow struts, with at least a section of their respective interior, form part of a closed cooling circuit of a cooling system for the container. For example, in the case of the frame construction, rectangular hollow tube profiles may be provided in order to ensure the stability of the container. Likewise, in the floor region, hollow tube profiles which are parallel and run transversely to the side walls may be provided as floor reinforcement, which takes away the load due to the weight of components arranged in the container, for example. In accordance an exemplary embodiment of the present disclosure, provision is made for the respective interiors of at least some of the cavity profiles to be flow-connected to one another as part of a closed cooling circuit of the container.

Thus, a closed cooling circuit between one or more evaporators and one or more condensers can be advantageously integrated in a tubular cavity already provided without the interior of the container that is available thereby being reduced. This can then be used to the full extent with electrical or other components required for a testing system, for example by converters.

According to an exemplary embodiment of the present disclosure, an evaporator of a cooling system for the container is formed by at least some of the hollow struts, for example the interior of floor cavity profiles which are connected in series in meandering fashion, wherein, for this purpose, if necessary corresponding condensers and pump means are required. Therefore, for example, the container floor can be equipped completely with a cooling function without additional space being required.

In accordance with an exemplary embodiment of the present disclosure, it is also possible for a separate hose-like or tube-like hollow body to be guided in the interior of at least one hollow strut, and a section of the closed cooling circuit is formed by the hollow body. In this case, the interior of the hollow struts is ultimately not used directly as the pipeline, but merely as a guide channel for a further hose or pipeline guided therein. The space-saving effect is the same, but an increased degree of safety is ensured in respect of possible leakage of the cooling circuit, because the internal line through the hollow strut profile is protected correspondingly in respect of mechanical loading.

Exemplary embodiments of the present disclosure also provide a testing station system for power transformers, wherein the testing station system has a modular design and includes at least one testing container according to the present disclosure that includes corresponding power transformer test apparatuses. As has been mentioned at the outset, the modular design enables simple transport and problem-free construction in situ, preferably using containers or right-parallelepiped-like receptacles as the housing, in particular because the test components are at least predominantly already arranged in a fixed position within the container. In addition, the modular arrangement enables electrical interconnection, as required, of a plurality of standardized components, such as converter modules, for example, to form a testing system. For example, the performance of a testing station can be increased in a correspondingly simple manner by implementing a further converter module. By using a testing container according to the present disclosure with a space-saving cooling system and a heat exchanger that can be moved out of the testing container, the rated power of a testing module which can be realized is advantageously increased.

It is also possible for any other desired test modules, which are configured similar to containers, for example, to be interconnected with one another to form an individual test system. A further such module is, for example, a test transformer for transforming a test voltage generated, which test transformer is likewise arranged in a container with corresponding load transfer points. Load transfer points are provided at the respective corner points in the case of containers, namely four at the bottom and four at the top. By virtue of load transfer points defined in this way, any desired stacking of the standardized containers, for example during transport on ships, is possible. It is also possible to use a container directly as an oil tank for a transformer arranged therein. In such an embodiment, the transport of the transformer in the container can take place without any oil filling, wherein the container acting as oil tank is then filled with oil in situ. It has also proven expedient to remove any outgoing lines from the container during transport and to fit them in situ.

It has proven particularly advantageous to use a testing container according to the present disclosure with a particularly space-saving cooling system for the arrangement of converters for a testing station system because the converters have a particularly high cooling requirement owing to the relatively high converter losses. It is of course also possible, however, for other components of a test system which produce waste heat during testing operation to be arranged in a testing container according to the present disclosure.

Further advantageous possible configurations are set forth in the following description of exemplary embodiments with reference to the drawings.

FIG. 1 shows a first exemplary testing container 10 with in total six heat exchangers 18, 20 which have been moved outwards in the working position. The heat exchangers 18, 20 are in the form of condensers and are part of a closed cooling circuit including evaporators, which are not shown in this drawing and are to be assumed as being arranged in inverter cabinets 14, 16. The closed cooling circuit between the respective condensers 18, 20 and the evaporators is at least partially formed by flexible hose lines 36, 38, which make it possible to move the heat exchangers in and out without the cooling circuit being impaired thereby. The heat exchangers 18, 20 are in the form of flat right-parallelepipeds and are movable out of the side walls of the testing container 10 in a manner similar to a drawer by means of movement apparatuses 22, 24 similar to telescopic rails. For this purpose, a respective drive apparatus may also be provided. As a result, in the withdrawn state, a space-saving arrangement of the heat exchangers 18, 20 in the interior of the testing container 10 is made possible and, in the extended state, a cooling power is made possible which is considerably increased owing to an increased contact area with the ambient air. In order to further increase the cooling power, respective fans 26, 28 are provided, which ensure a forced flow around the heat exchangers 18, 20 or the condensers. Cooling ribs 30 which are fitted on the surface of the heat exchangers 18, 20 and are preferably manufactured from a metal which has good thermal conduction properties, for example aluminum, are used for the same purpose.

The outer limit of the testing container 10 is formed by a right-parallelepiped-like container 12, for example a 40 foot container with CSC approval. In the right-hand part of the container 12, a control room 34 is provided, separated by a partition wall 32, in which control room, for example, control computers for the test system are accommodated. However, it is quite possible for this space to also be used for further inverter cabinets 14, 16 or other electrical components. An advantage of a testing container 10 according to the present disclosure includes the arrangement of electrical components with a high incidence of heat losses, such as converters in this example.

Figure 2:
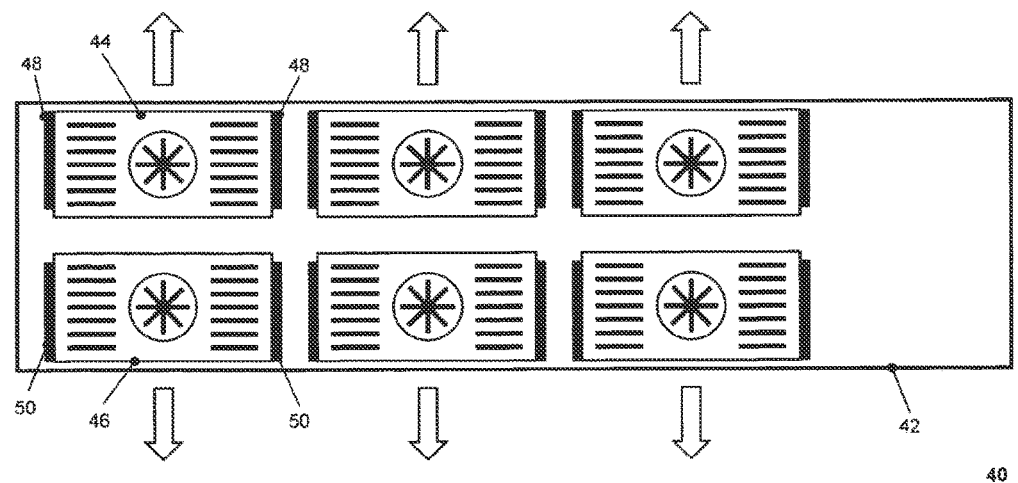
FIG. 2 shows a testing container in the transport position according to an exemplary embodiment of the present disclosure.

FIG. 2 shows a second exemplary testing container 40 in the transport position. This largely corresponds to the first testing container 10. In a right-parallelepiped-like container 42, six inverter cabinets are arranged which are hidden by respective withdrawn heat exchangers 44, 46. These are capable of being moved out of the container through container openings (not shown) by means of movement apparatuses 48, 50 similar to telescopic rails. In the transport position shown, the testing container 40 can be transported without any problems by means of ship, lorry or rail to its intended location, where it can then be interconnected together with other test system modules preferably likewise arranged in containers to form a test system.

Figure 3:
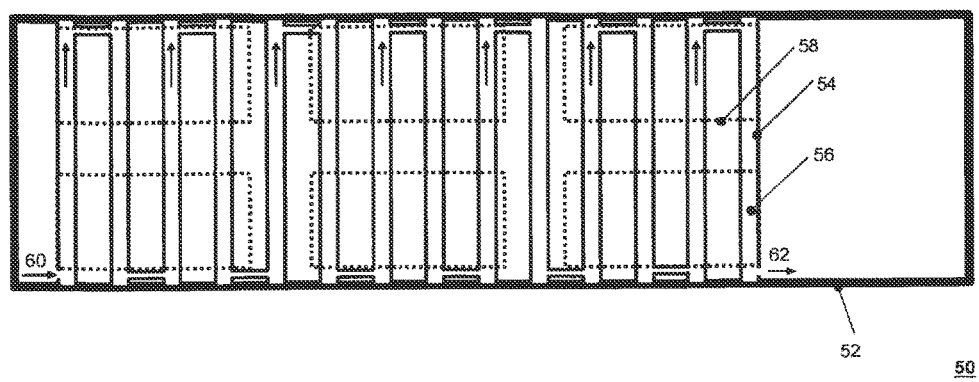
FIG. 3 shows the floor region of a right-parallelepiped-like container including hollow struts, according to an exemplary embodiment of the present disclosure.

FIG. 3 shows the floor region 50 of a third right-parallelepiped-like container including hollow struts 54 arranged in parallel as floor reinforcement. The floor region 50 is surrounded by a frame structure 52, which is formed from rectangular hollow profiles, for example consisting of steel. Such a floor structure is conventional for containers which, in accordance with standards, have approval, for example, for a total weight of at most 30.48t. In the figures, the parallel hollow struts 54, which have a cross section of 8 cm ×8 cm, for example, are connected with their internal hollow cavities 56 via additional cross connections to form a tubular, serpentine-like structure, which is suitable for allowing a flow of coolant to pass through. In this way, it is possible to guide at least some of a coolant circuit through the container without additional space being required. The cooling medium inflow into the serpentine-like structure is indicated by reference numeral 60, and the outflow is indicated by reference numeral 62. It is also possible to design the coolant circuit with a separate forward and return flow, i.e. ultimately two serpentine-like structures each having every second hollow strut.

In addition to its additional function according to the present disclosure of forming part of a cooling circuit of the container with their respective interior 56, the hollow struts also perform the task of transferring the load of components 58 arranged in the container, in this example inverter cabinets indicated by dashed lines. Owing to the direct vicinity to the serpentine-like structure in which a cooling medium of the closed cooling circuit is guided, a connection of an evaporator arranged in a respective inverter cabinet is possible without any problems, with the result that the heat loss can be transported away directly at the heat source, namely the converters arranged in the respective inverter cabinet 58.

Figure 4:
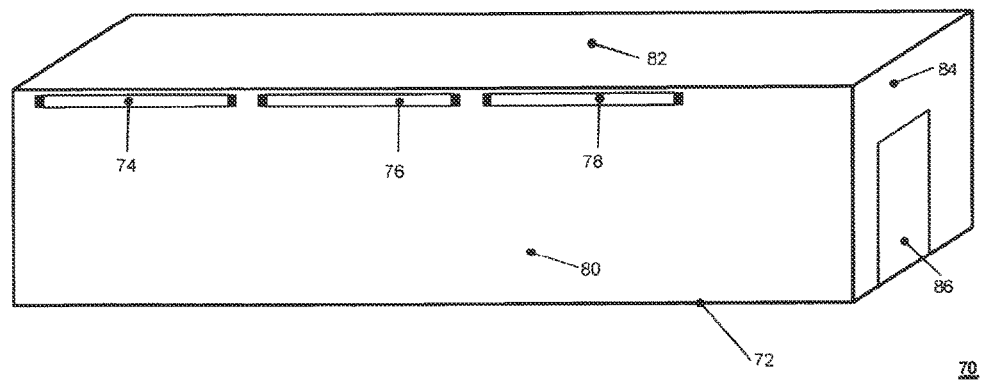
FIG. 4 shows a testing container in the transport position according to an exemplary embodiment of the present disclosure.

FIG. 4 shows a third exemplary testing container 70 in the transport position, i.e. with the heat exchangers (not shown) withdrawn. The testing container in this view includes substantially a right-parallelepiped-like container 72, of which a side wall 80, a roof 82 and an end wall 84 are shown, which container is bordered an access door 86 to a control room (not shown). Three closable openings 74, 76, 78 are indicated in the upper region of the side wall 80, through which openings respective heat exchangers or condensers of a cooling system can be moved out of the container 72.

Figure 5:
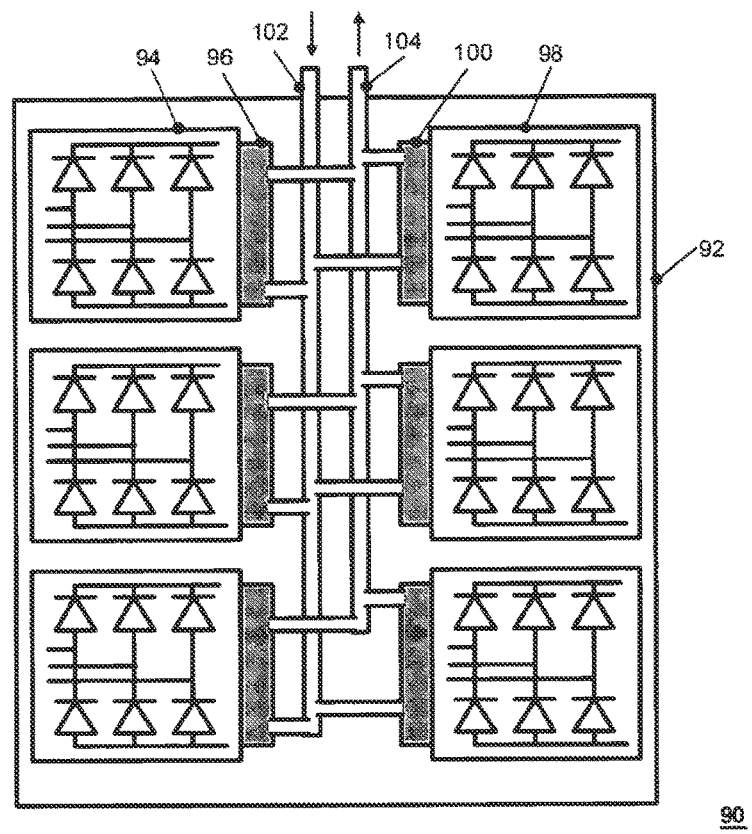
FIG. 5 shows an inverter cabinet according to an exemplary embodiment of the present disclosure.

FIG. 5 shows a basic sketch of an exemplary inverter cabinet 90. A plurality of inverter modules 94, 98, which are interconnected electrically to one another, and to which in each case directly a respective evaporator 96, 100 of a closed cooling system is assigned, are arranged in a cabinet-like enclosure 92. Coolant is fed and discharged via a respective coolant feed 102 and coolant discharge 104, respectively, which for their part are connected to a condenser (not shown). This arrangement advantageously enables direct cooling of the heat-generating components 94, 98.

Figure 6:
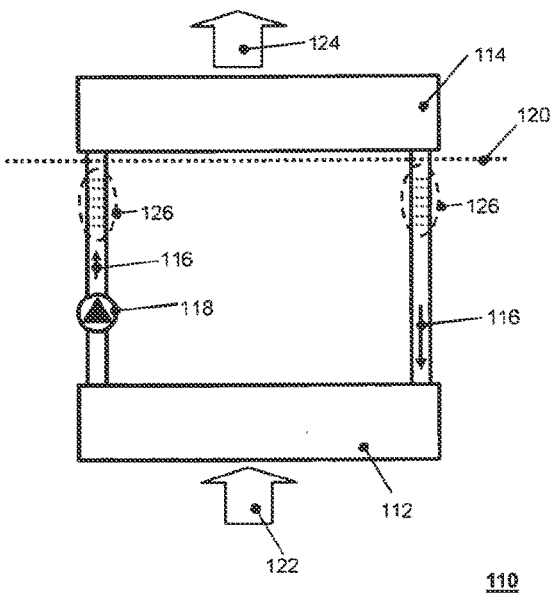
FIG. 6 shows a closed cooling circuit including an evaporator and a condenser, according to an exemplary embodiment of the present disclosure.

FIG. 6 shows an exemplary closed cooling circuit 110 including an evaporator 112 and a condenser 114, which are sectionally connected to one another by means of at least sectionally flexible lines 126. The evaporator 112 takes up thermal energy 122 which is produced in an inverter, for example, by evaporation of a coolant located in the evaporator. In the process, the coolant flows in the flow direction indicated by the arrows 116 to the condenser 114 and outputs thermal energy 124 to the surrounding environment via the condenser. The evaporator 112 and the condenser 114 are separated by a container wall 120, with the result that the condenser is therefore located precisely in a working position to be assumed outside the container. In order to keep the coolant in the coolant circuit circulating, a pump 118 is provided.

It will therefore be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

10 First exemplary testing container in working position
12 First right-parallelepiped-like container
14 First electrical component (inverter cabinet)
16 Second electrical component (inverter cabinet)
18 First heat exchanger (condenser) in working position
20 Second heat exchanger (condenser) in working position
22 Movement apparatus for first heat exchanger 24 Movement apparatus for second heat exchanger
26 Fan for first heat exchanger
28 Fan for second heat exchanger
30 Cooling rib
32 Partition wall
34 Control room
36 First flexible hose connection
38 Second flexible hose connection
40 Second exemplary testing container in transport position
42 Second right-parallelepiped-like container
44 First heat exchanger (condenser) in transport position
46 First heat exchanger (condenser) in transport position
48 Movement apparatus for first heat exchanger
49 Movement apparatus for second heat exchanger
50 Floor region of third right-parallelepiped-like container including hollow struts
52 Frame structure
54 Hollow struts
56 Interior of hollow struts
58 Component arranged in container
60 Cooling medium feed
62 Cooling medium discharge
70 Third exemplary testing container in transport position
72 Fourth right-parallelepiped-like container
74 First opening for outwardly movable first heat exchanger
76 Second opening for outwardly movable second heat exchanger
78 Third opening for outwardly movable third heat exchanger
80 Side wall of container
82 Roof of container
84 End wall of container
86 Door
90 Exemplary inverter cabinet
92 Enclosure
94 First exemplary inverter module
86 Evaporator for first inverter module
98 Second exemplary inverter module
100 Evaporator for second inverter module
102 Cooling medium feed
104 Cooling medium discharge
110 Closed cooling circuit including evaporator and condenser
112 Evaporator
114 Condenser
116 Flow direction of cooling medium
118 Pump
120 Container wall
122 Heat input
124 Heat output
126 Sectionally flexible hose line

What is claimed is:

1. A testing container, comprising
a right-parallelepiped-like container;
electrical components of a transformer test system which are arranged in the container and which represent a respective heat source during a testing operation;
a cooling system including at least one heat exchanger; and
a movement apparatus configured to move the at least one heat exchanger from a transport position within the container into a working position which is located at least partially outside the container.

2. The testing container as claimed in claim 1, wherein the cooling system comprises a closed cooling circuit of a cooling medium, and wherein the at least one heat exchanger is a condenser, and at least one evaporator connected to the condenser via the cooling circuit is comprised in an interior of the container.

3. The testing container as claimed in claim 2, wherein the cooling circuit is formed between the at least one movable condenser and the at least one evaporator at least sectionally by a flexible hose line.

4. The testing container as claimed in claim 3, comprising:
a plurality of evaporators in the direct vicinity of respective heat sources in the interior of the container.

5. The testing container as claimed in claim 2, comprising:
a plurality of evaporators in the direct vicinity of respective heat sources in the interior of the container.

6. The testing container as claimed in claim 1, wherein the at least one heat exchanger is movable in drawer-like fashion through openings provided for this purpose out of a side wall of the container.

7. The testing container as claimed in claim 6, wherein a plurality of heat exchangers are movable out of one or more side walls of the container.

8. The testing container as claimed in claim 1, wherein a plurality of heat exchangers are movable out of one or more side walls of the container.

9. The testing container as claimed in claim 1, comprising:
means for effecting a forced flow of ambient air around or through the at least one heat exchanger.

10. The testing container as claimed in claim 1, wherein the right-parallelepiped-like container has the dimensions of a standard transport container and is approved in accordance with CSC (International Convention for Safe Containers).

11. The testing container as claimed in claim 1, wherein the right-parallelepiped-like container has an internal supporting structure comprising hollow struts, and at least some of the hollow struts, with at least a section of their respective interior, form part of a closed cooling circuit of the cooling system for the container.

12. The testing container as claimed in claim 11, wherein a plurality of hollow struts are arranged on a base of the container, the hollow struts being configured to transfer a load due to the weight of components arranged in the container and whose respective interiors are flow-connected to one another as part of the closed cooling circuit.

13. The testing container as claimed in claim 12, wherein the plurality of hollow struts are arranged parallel to one another.

14. The testing container as claimed in claim 12, comprising:
an evaporator of a cooling system for the container, the evaporator being formed by at least some of the hollow struts.

15. The testing container as claimed in claim 11, comprising:
an evaporator of a cooling system for the container, the evaporator being formed by at least some of the hollow struts.

16. The testing container as claimed in claim 15, comprising:
a separate hose-like or tube-like hollow body guided in the interior of at least one hollow strut,
wherein a section of the closed cooling circuit is formed by the hollow body.

17. The testing container as claimed in claim 11, comprising:
a separate hose-like or tube-like hollow body guided in the interior of at least one hollow strut, wherein a section of the closed cooling circuit is formed by the hollow body.

18. A testing station system for power transformers, the testing station system having a modular design and comprising at least one testing container as claimed in claim 1 having corresponding power transformer test apparatuses.

19. The testing station system for power transformers as claimed in claim 18, comprising:
an inverter for test purposes, the inverter being formed by the electrical components arranged in at least one right-parallelepiped-like container.

* * * * *